US012721245B2

(12) United States Patent
Otremba et al.

(10) Patent No.: US 12,721,245 B2
(45) Date of Patent: Aug. 25, 2026

(54) POWER SEMICONDUCTOR DEVICE

(71) Applicant: Infineon Technologies Austria AG, Villach (AT)

(72) Inventors: Ralf Otremba, Kaufbeuren (DE); Christian Fachmann, Villach (AT)

(73) Assignee: Infineon Technologies Austria AG, Villach (AT)

( * ) Notice: Subject to any disclaimer, the term of this patent is extended or adjusted under 35 U.S.C. 154(b) by 744 days.

(21) Appl. No.: 18/111,242

(22) Filed: Feb. 17, 2023

(65) Prior Publication Data

US 2023/0268255 A1 Aug. 24, 2023

(30) Foreign Application Priority Data

Feb. 22, 2022 (EP) .................................... 22158078

(51) Int. Cl.
*H10W 90/00* (2026.01)
*H10W 70/40* (2026.01)
(Continued)

(52) U.S. Cl.
CPC ........ *H10W 90/811* (2026.01); *H10W 70/466* (2026.01); *H10W 70/481* (2026.01);
(Continued)

(58) Field of Classification Search
CPC ............. H01L 25/072; H01L 23/49575; H01L 23/3107; H01L 23/49562; H01L 24/40; H01L 24/48; H01L 24/73; H01L 2924/181; H01L 2924/13091; H10W 70/481; H10W 70/466; H10W 72/527; H10W 72/871; H10W 72/926; H10W 90/767; H10W 74/00; H10W 90/766; H10W 72/07552; H10W 74/111; H10W 90/811; H10W 90/00; H10W 90/756; H10W 90/763; H10W 90/755; H10W 70/766; H10W 72/075; H10W 70/465; H10W 70/72; H10W 70/884; H10W 72/886;
(Continued)

(56) References Cited

U.S. PATENT DOCUMENTS 10,802,053 B2 * 10/2020 Sander ............... H03K 17/6871
11,721,616 B2 * 8/2023 Voss .................. H01L 23/49575 257/77

(Continued)

FOREIGN PATENT DOCUMENTS

JP H0590464 A 4/1993

*Primary Examiner* — Alonzo Chambliss
(74) *Attorney, Agent, or Firm* — Murphy, Bilak & Homiller, PLLC

(57) ABSTRACT

A power semiconductor device includes: a package and a plurality of power semiconductor chips, each power semiconductor chip including a semiconductor body, a first load terminal, a second load terminal and a control terminal. The device also includes a plurality of outside terminals. The outside terminals include: one or more first outside terminals electrically connected with the first load terminals; one or more second outside terminals each of which is electrically connected with each of the second load terminals; and a plurality of third outside terminals. Each control terminal is electrically connected with at least one individual third outside terminal of the plurality of third outside terminals.

23 Claims, 6 Drawing Sheets

(51) Int. Cl.
*H10W 72/00* (2026.01)
*H10W 72/30* (2026.01)
*H10W 74/10* (2026.01)

(52) U.S. Cl.
CPC ....... *H10W 72/073* (2026.01); *H10W 72/865* (2026.01); *H10W 72/868* (2026.01); *H10W 72/884* (2026.01); *H10W 72/886* (2026.01); *H10W 74/111* (2026.01); *H10W 90/00* (2026.01); *H10W 70/465* (2026.01); *H10W 72/30* (2026.01); *H10W 72/871* (2026.01); *H10W 90/755* (2026.01); *H10W 90/767* (2026.01)

(58) Field of Classification Search
CPC ............. H10W 72/865; H10W 72/868; H10W 72/073; H10W 72/30
See application file for complete search history.

(56) References Cited

U.S. PATENT DOCUMENTS

| | | | | |
|---|---|---|---|---|
| 11,742,333 | B2 * | 8/2023 | Sato | H10W 90/00 257/668 |
| 2008/0122063 | A1 | 5/2008 | Akiba | |
| 2011/0316135 | A1 * | 12/2011 | Urushihata | H10W 70/481 257/676 |
| 2013/0181228 | A1 * | 7/2013 | Usui | H01L 23/4334 257/E21.705 |
| 2013/0264697 | A1 | 10/2013 | Notsu et al. | |
| 2015/0287665 | A1 * | 10/2015 | Hanada | H10W 20/40 257/691 |
| 2019/0304879 | A1 * | 10/2019 | Saito | C25D 7/12 |
| 2023/0108305 | A1 * | 4/2023 | Miyazaki | H10W 90/00 257/703 |

* cited by examiner 1
2
20
201
202
220
21
22
23
24
11
110
111
13
131
14
141
15
1-1
1-2
1-3
1-4
1-5
290
X
Y
Z 1
2
20
220
202
201
22
21
11
110
112
141
131
13
14
15
23
24
1-1
1-2
1-3
1-4
1-5
290
X
Y
Z 1
2
20
201
202
220
22
21
1-1
1-2
1-3
1-4
11
13
14
15
131
141
151
23
24
25
210-1
210-2
290
X
Y
Z 2
220
20
201
202
21
22
1-1
1-2
1-3
1-4
1-99
11-99
13-99
26
261
210-1
210-2
11
13
14
15
131
141
151
23
24
25
290
X
Y
Z
1

POWER SEMICONDUCTOR DEVICE

TECHNICAL FIELD

This specification refers to embodiments of a power semiconductor device. In particular, the specification refers to embodiments of a power semiconductor device having a package and a plurality of power semiconductor chips arranged within a housing of the package. The chips are arranged and contacted in accordance with specific configuration.

BACKGROUND

Many functions of modern devices in automotive, consumer and industrial applications, such as converting electrical energy and driving an electric motor or an electric machine, rely on power semiconductor chips. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor chip usually comprises a semiconductor body, e.g., based on Si or SiC, and configured to conduct a forward load current along a load current path between two load terminals of the chip.

Further, in case of a controllable power semiconductor chip, e.g., a transistor, the load current path may be controlled by means of an insulated electrode, commonly referred to as gate or control electrode. For example, upon receiving a corresponding control signal from, e.g., a driver unit, the control electrode may set the power semiconductor chip in one of a forward conducting state and a blocking state.

After the power semiconductor chip has been manufactured, it is usually installed within in a package, e.g., in a manner that allows the package with the chip(s) to be arranged within an application, e.g., in a power converter or power supply system, e.g., such that the chip(s) may be coupled, as part of the package, to a carrier, e.g., a printed circuit board (PCB).

There are several possibilities to integrate multiple chips within the package. For example, the chips may be arranged in accordance with a certain circuit topology, such as a half-bridge or a full-bridge or another circuit topology. In such case, the package may be operated corresponding to the circuit structure, e.g., operated as half-bridge or a full-bridge.

In other variants, multiple chips are integrated within the package, wherein each chip may fulfil the same function. To this end, the chips may be connected in parallel with each other. Such devices are typically called discrete devices.

It is an object of the present invention to provide a power semiconductor device including a plurality of chips within a package, wherein the chips may advantageously be operated in parallel.

SUMMARY

The invention is defined by the independent claim. Features of some of the herein exemplarily described embodiments are defined by the dependent claims.

For example, a power semiconductor device comprises a package having a housing, wherein the housing has a first side and a second side opposite to the first side. Within the housing, a plurality of power semiconductor chips are arranged, each comprising a semiconductor body and, coupled to the semiconductor body, a first load terminal and a second load terminal; and a control terminal, wherein the semiconductor body is configured to conduct a load current between the first load terminal and the second load terminal based on a control signal received via the control terminal. The device comprises a plurality of outside terminals configured to provide for an electrical connection between the terminals of the chips within the housing and components of a power circuit external of the package, said outside terminals comprising one or more first outside terminals electrically connected with the first load terminals; one or more second outside terminals, each of which being electrically connected with each of the second load terminals; and a plurality of third outside terminals, wherein each control terminal is electrically connected with at least one individual third outside terminal of the plurality of third outside terminals.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings.

DETAILED DESCRIPTION

Figure 1:
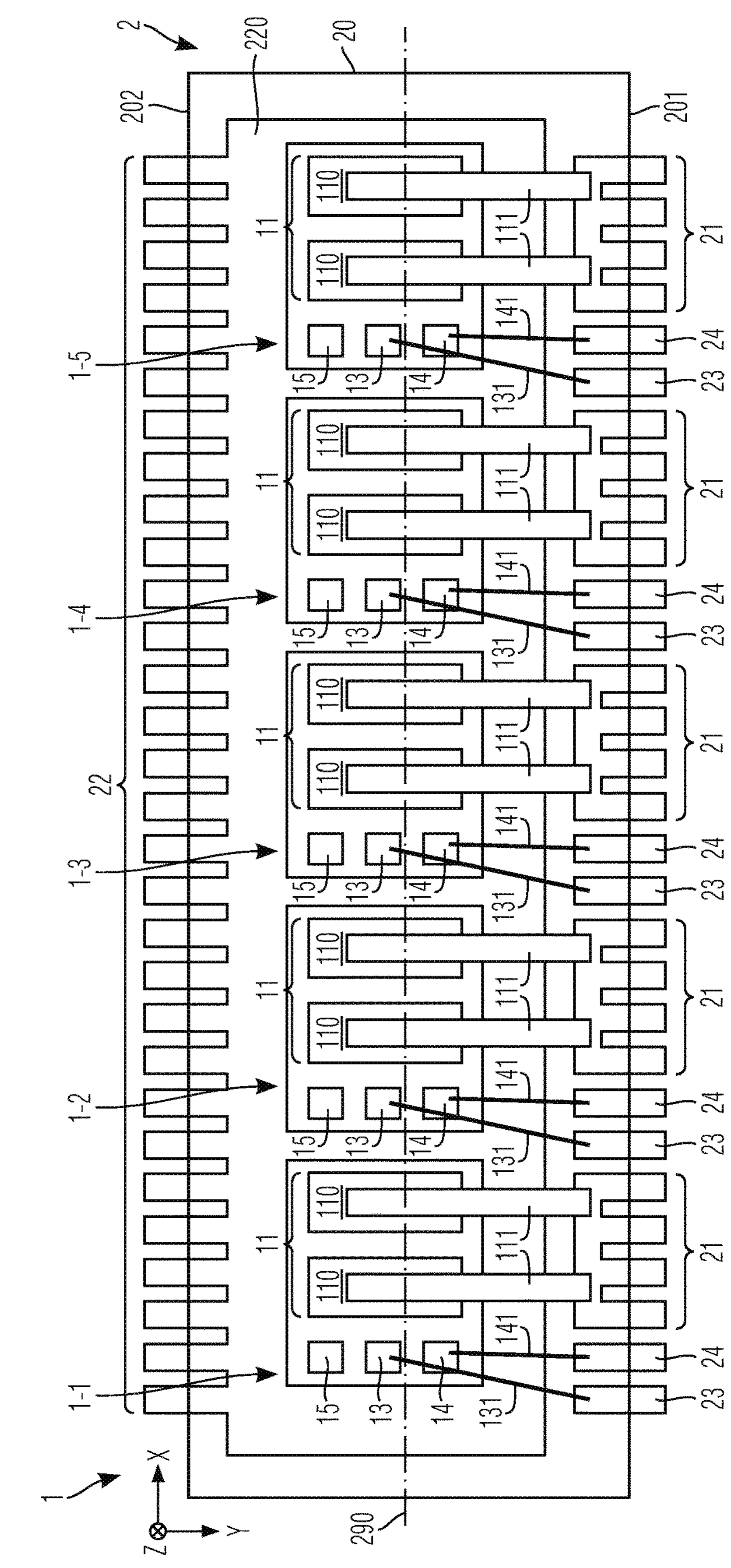
FIGS. 1-5 each schematically and exemplarily illustrate a section of a horizontal projection of a power semiconductor device in accordance with some embodiments.

In the following detailed description, reference is made to the accompanying drawings which form a part hereof and in which are shown by way of illustration specific embodiments in which the invention may be practiced.

In this regard, directional terminology, such as “top”, “bottom”, “below”, “front”, “behind”, “back”, “leading”, “trailing”, “above” etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a mean horizontal surface of a semiconductor substrate or of a semiconductor structure. This can be for instance the surface of a semiconductor chip or, respectively, of a virtual plane on top of a surface that is not entirely flat (e.g., in case of a SiC based semiconductor body). For example, both the first lateral direction X and the second lateral direction Y mentioned herein can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of said surface. For example, the vertical direction Z mentioned herein may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other does not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to a power semiconductor device including several chips within a package, e.g., chips having a configuration of one of an IGBT, an RC IGBT, a field effect transistor (e.g., a MOSFET, FinFET, JFET), a diode or a derivative thereof. The power semiconductor device described herein is configured to be used within an application, e.g., a power converter or a power supply. Thus, in an embodiment, such power semiconductor device can be configured to carry a load current that is to be fed to a load and/or, respectively, that is provided by a power source.

The term "chip" as used in this specification intends to describe a single chip with high voltage blocking and/or high current-carrying capabilities. In other words, embodiments of the power semiconductor device described herein are multi-chip power semiconductor devices configured for high current, typically in the Ampere range, e.g., up to several Ampere or up to several ten or hundred Ampere, and/or high voltages, typically 200 V and above, e.g., up to above at least 400 V or even more, such as 800 V, or, e.g., above at least 2 kV, or even above 6 kV or more.

For example, the power semiconductor device described below may be a multi-chip power semiconductor device configured to be employed as a power component in a low-, medium- and/or high voltage application, such as a home appliance, a general purpose drive, an electric-drive train, a servo drive, a traction, a (higher) power transmission facilities, etc.

For example, the term "power semiconductor device" as used in this specification is not directed to a logic semiconductor device used for, e.g., storing data, computing data and/or other types of semiconductor-based data processing.

Each of FIG. 1 to FIG. 5 schematically and exemplarily illustrates a section of a horizontal projection of a power semiconductor device 1, herein also simply referred to as device 1, in accordance with some embodiments. The following description refers to each of theses Figures, if not explicitly stated otherwise.

The power semiconductor device 1 comprises a package 2 having a housing 20, wherein the housing 20 has a first side 201 and a second side 202 opposite to the first side 201. For example, the first side 201 and the second side 202 form opposite vertical sidewalls of the housing 20 and extend in parallel to the vertical direction Z and the first lateral direction X. The housing 20 may further have a top side and a footprint side, e.g., both extend in parallel to the first lateral direction X and the second lateral direction Y. The package 2 may for example have a surface-mounted-device, SMD, configuration, either with top side cooling or with bottom side cooling, or a through-hole-device configuration.

A plurality of, e.g., identical, power semiconductor chips 1-1 to 1-5 are arranged within the housing 20. The Figures show variants with four or five chips, wherein the device 1 may of course comprise more or less than four/five chips.

In an embodiment, each of the power semiconductor chips 1-1 to 1-4/1-5 is identically configured. For example, the chips may be identical in terms of size, function and structure. For example, each chip has a MOSFET configuration.

Figure 6:
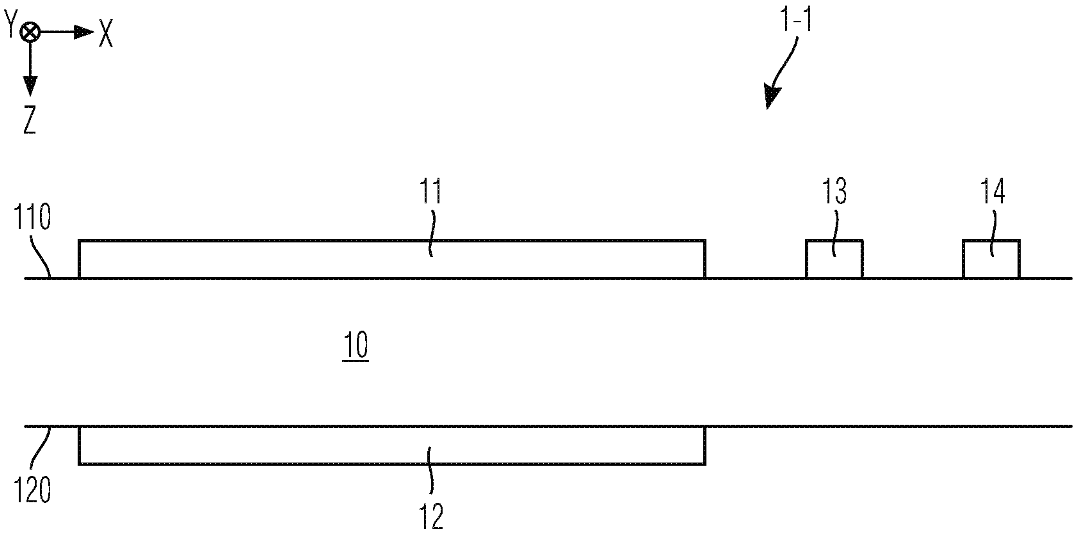
FIG. 6 schematically and exemplarily illustrates a section of a vertical cross-section of a power semiconductor chip in accordance with one or more embodiments.

An exemplary chip configuration is schematically illustrated in FIG. 6. Accordingly, the chip 1-1 may comprise a semiconductor body 10 and, coupled to the semiconductor body 10, a first load terminal 11 and a second load terminal 12. The chip 1-1 further comprises a control terminal 13, wherein the semiconductor body 10 is configured to conduct a load current between the first load terminal 11 and the second load terminal 12 based on a control signal received via the control terminal 13. FIG. 6 illustrates a vertical design, according to which the first load terminal 11 is arranged at a first side 110 of the semiconductor body 10 and the second load terminal 12 is arranged at a second side 120 of the semiconductor body 10, wherein the first side 110 (e.g., a top side) is opposite of the second side 120 (e.g., a bottom side). For example, the semiconductor body 10 extends from the first side 110 along the vertical direction Z to the second side 120. However, the present disclosure is not limited to chips having a vertical design. For example, in other embodiments, the chips exhibit a horizontal design according to which both load terminals 11 and 12 are arranged at the same side, e.g., either at the first side 110 or at the second side 120. The chip 1-1 may further comprise a sense terminal 14, e.g., for sensing a temperature of the chip 1-1 or another parameter.

The specific configuration of the chip 1-1 is presently of less significance. For example, the chip 1-1 may have a MOSFET (or another unipolar) configuration and the semiconductor body 10 may be structured, in terms of doped regions, electrodes etc., accordingly. Then, the first load terminal 11 may be a source terminal, the second load terminal 12 may be a drain terminal and the control terminal 13 may be a gate terminal. Or, the chip 1-1 may have an IGBT (or another bipolar) configuration and the semiconductor body 10 may be structured, in terms of doped regions, electrodes etc., accordingly. Then, the first load terminal 11 may be an emitter terminal, the second load terminal 12 may be a collector terminal and the control terminal 13 may be a gate terminal.

Further, the semiconductor body 10 of the chip 1-1 can be made of a wide-bandgap-semiconductor material, such as silicon carbide, SiC, or gallium nitride, GaN. For example, the chip 1-1 may have a GaN-FET configuration, e.g., a lateral GaN-HEMT (High Electron Mobility Transistor) configuration. In another embodiment, the semiconductor body 10 is made of silicon, Si.

The remaining chips 1-2 to 1-4/1-5 of the plurality of chips in the package 2 may be identically configured as chip 1-1.

Again referring to FIGS. 1 to 5, the power semiconductor device 1 comprises a plurality of outside terminals 21, 22, 23 configured to provide for an electrical connection between the terminals 11, 12, 13 of the chips 1-1 to 1-2/1-5 within the housing 20 and components of a power circuit (not illustrated) external of the package 2. For example, the outside terminals may exhibit a pin structure, as illustrated in FIGS. 1 to 5. For example, the part of the respective outside terminal external of the housing 20 may be configured to be coupled to a terminal of circuit, e.g., a converter or inverter circuit, e.g., by soldering. The outside terminals comprise:

- one or more first outside terminals 21 electrically connected with the first load terminals 11;
- one or more second outside terminals 22, each of which being electrically connected with each of the second load terminals 12;
- a plurality of third outside terminals 23, wherein each control terminal 13 is electrically connected with at least one individual third outside terminal of the plurality of third outside terminals 23.

Such configuration may allow for an advantageous parallel operation of the chips 1-1 to 1-4/1-5 within the housing 20. For example, based on that each of the one or more second outside terminals 22 is electrically connected with each of the second load terminals 12 (e.g., drain terminals), the chips 1-1 to 1-4/1-5 may be connected in parallel. For example, also each of the one or more first outside terminals 21 may be electrically connected with each of the first load terminals 11, wherein such parallel connection may occur within the housing or external thereof, as will be explained in more detail below. But, each control terminal 13 is electrically connected with at least one individual third outside terminal of the plurality of third outside terminals 23. That is, the control terminals 13 are not necessarily connected in parallel, but each chip 1-1 to 1-4/1-5 may be individually connected. Of course, each chip 1-1 to 1-4/1-5 may receive the same control signal. Due to the individual connection of the control terminals 13, it may be ensured that a distance between a respective one of the third outside terminal 23 to the control terminal 13 of the respective chip is substantially the same for each chip 1-1 to 1-4/1-5, which may in turn ensure that the chips 1-1 to 1-4/1-5 are indeed operated (e.g., switched) simultaneously. For example, in terms of control and load terminal connections, a symmetric design is proposed according to which each chip 1-1 to 1-4/1-5 of the device 1 may be connected to external components in the same manner. For example, when the outside terminals 21, 22 and 23 are subjected to given reference voltage values, each of the plurality of identical chips 1-1 to 1-4/1-5 shows the same function due to substantially identical package internal terminal connections.

In an embodiment, the chips 1-1 to 1-4/1-5 are connected in parallel to fulfill the same switching function. Accordingly, the power semiconductor device 1 may be a discrete multi-chip power device, e.g., fulfilling the function of one MOSFET or one IGBT.

For example, each of the second outside terminals 22 is arranged at the second side 202 of the housing 20. Each of the first outside terminals 21 and each of the third outside terminals 23 can be arranged at the first side 201.

In an embodiment, the power semiconductor device 1 further comprises a lead frame structure 220 forming both the second outside terminals 22 and, e.g., within the housing, the electrical connection between the second outside terminals 22 and the second load terminals 12 of the chips 1-1 to 1-4/1-5. For example, the second load terminals are arranged at the bottom sides 120 of the chips 1-1 to 1-4/1-5, and the bottom sides 120 of the chips 1-1 to 1-4/1-5 are facing to the footprint side of the package 2. For example, the lead frame structure 220 may comprise a plate part extending below the chips 1-1 to 1-4/1-5 to establish the electrical connection with the second load terminals 12.

Further, each of the first outside terminals 21 and, optionally, each of the third outside terminal 23 can be arranged at the first side 201 of the housing 20, i.e., opposite to the second outside terminals 22. Such arrangement may allow for reliably ensuring an electrical insulation between the first outside terminals 21 and the second outside terminal 22.

As illustrated in FIGS. 1-5, the chips 1-1 to 1-4/1-5 are arranged laterally adjacent to each other along a straight line 290. The chips 1-1 to 1-4/1-5 may each be arranged in the same orientation, e.g., such that a distance between the control terminal 13 of the respective chip and the associated third outside terminal is substantially the same for each chip 1-1 to 1-4/1-5. For example, each chip 1-1 to 1-4/1-5 may be arranged spaced apart from the package sidewall 201 by the same first distance. Further, each chip 1-1 to 1-4/1-5 may be arranged spaced apart from the other package sidewall 202 by the same second distance.

For example, to establish, within the housing 20, the electrical connection between the control terminals 13 and the third outside terminals 23, bond wires 131 or the like may be used. Here, each of the control terminals 13 may be interrogated based on said at least one individual third outside terminal 23. Of course, two or more individual third outside terminals 23 may be connected in parallel to interrogate the same control terminal 13, but none of the control terminals 13 is electrically connected, within the housing 20, to another one of the control terminals 13. For example, the third outside terminals 23 are electrically insulated from each other.

In an embodiment, the chip-associated third outside terminals 23 are each connected to the control terminal 13 of the respective chip by said at least one bond wire 131 (or another electrically conducting component), wherein each bond wire 131 has a length within the range of 90% to 110% of a reference length. Thereby, it may be ensured that a control signal provided at the third outside terminals 23 becomes effective simultaneously for each chip 1-1 to 1-4/1-5.

In an embodiment of the power semiconductor device 1, each chip 1-1 to 1-4/1-5 further comprises, e.g., at the first side 110 (cf. FIG. 6), a sense terminal 14. The power semiconductor device 1 may further comprise a plurality of fourth outside terminals 24, wherein each sense terminal 14 is electrically connected with at least one individual fourth outside terminal of the plurality of fourth outside terminals 24. Thereby, an individual parameter (e.g., a temperature or voltage) may be sensed for each chip 1-1 to 1-4/1-5. The fourth outside terminals may also be arranged at the first side 201 of the housing 20, as illustrated in FIGS. 1-5. To establish, within the housing 20, the electrical connection between the sense terminals 14 and the fourth outside terminals 24, bond wires 141 or the like may be used.

In an embodiment of the power semiconductor device 1, each chip 1-1 to 1-4/1-5 further comprises, e.g., at the first side 110 (cf. FIG. 6), a further terminal 15, e.g., a further sense terminal, which may (FIGS. 3-5) or may not (cf. FIGS. 1 and 2) be connected to an outside terminal 25. Thus, a further individual parameter (e.g., a temperature or voltage) may be sensed for each chip.

Figure 2:
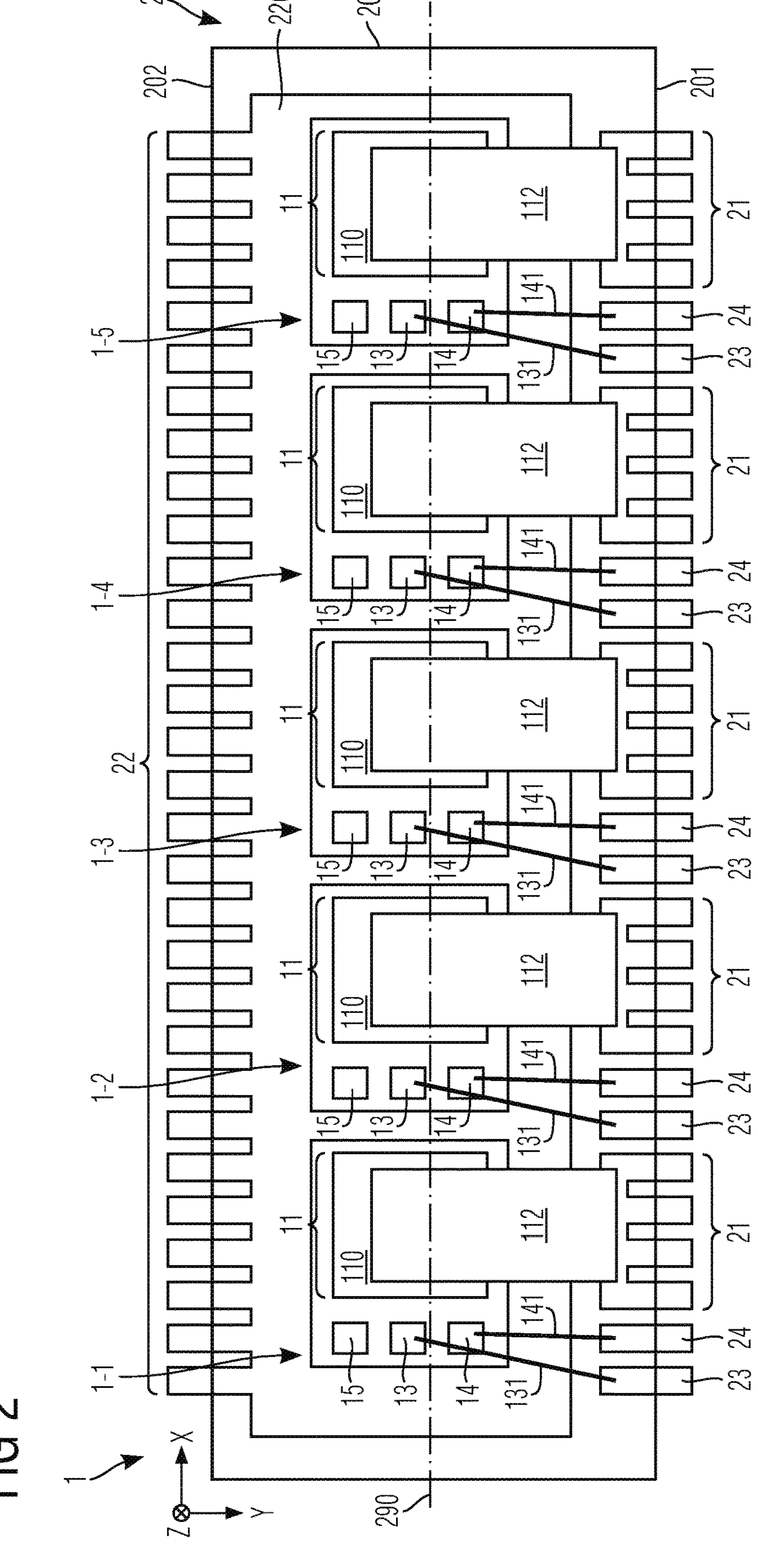

Regarding the electrical connection, within the housing 20, between the first outside terminals 21 and the first load terminals 11, several variants are possible:

Referring to FIG. 1, each first load terminal 11 is electrically connected with at least one individual first outside terminal of the plurality of first outside terminals 21. Since the chip load current must be carried by the respective at least one individual first outside terminal 21, it can be appropriate to associate for than one, e.g., four respective individual first outside terminals 21 with each chip, as illustrated in FIG. 1. Further, it shall be understood that the chip's first load terminal 11 may comprise single contiguous first load terminal area, as illustrated in FIG. 2, or exhibit a distributed structure with separate terminal areas 110, as illustrated in FIG. 1. In the latter case (cf. FIG. 1), each terminal area may be coupled to the chip-associated first outside terminal(s) 21 via an individual bridge member 111. In the first case (cf. FIG. 2), the first load terminal 11 may be electrically connected with the chip-associated first outside terminal(s) via a larger bridge member 112, e.g., a clip or the like.

Figure 3:
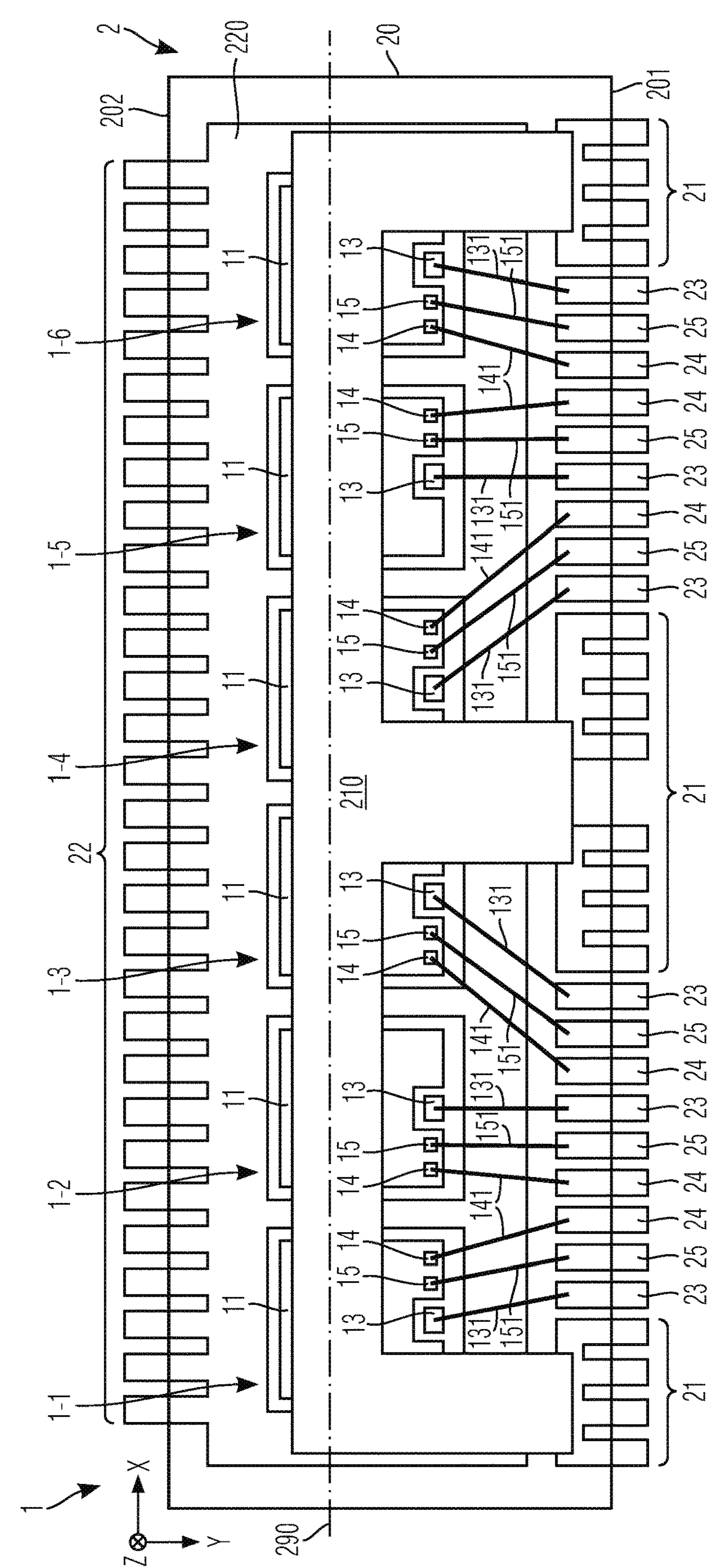
Figure 4:
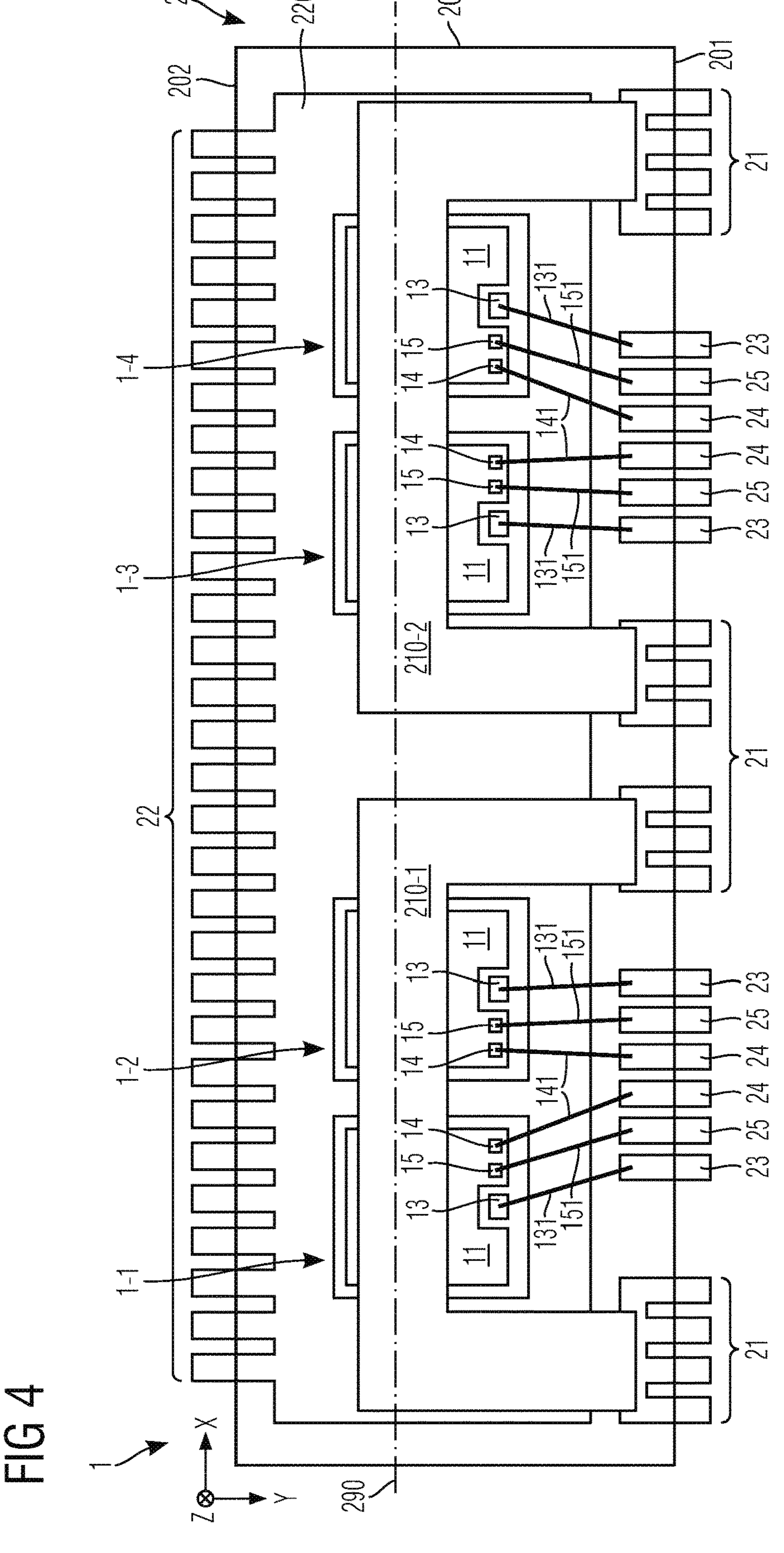
Figure 5:
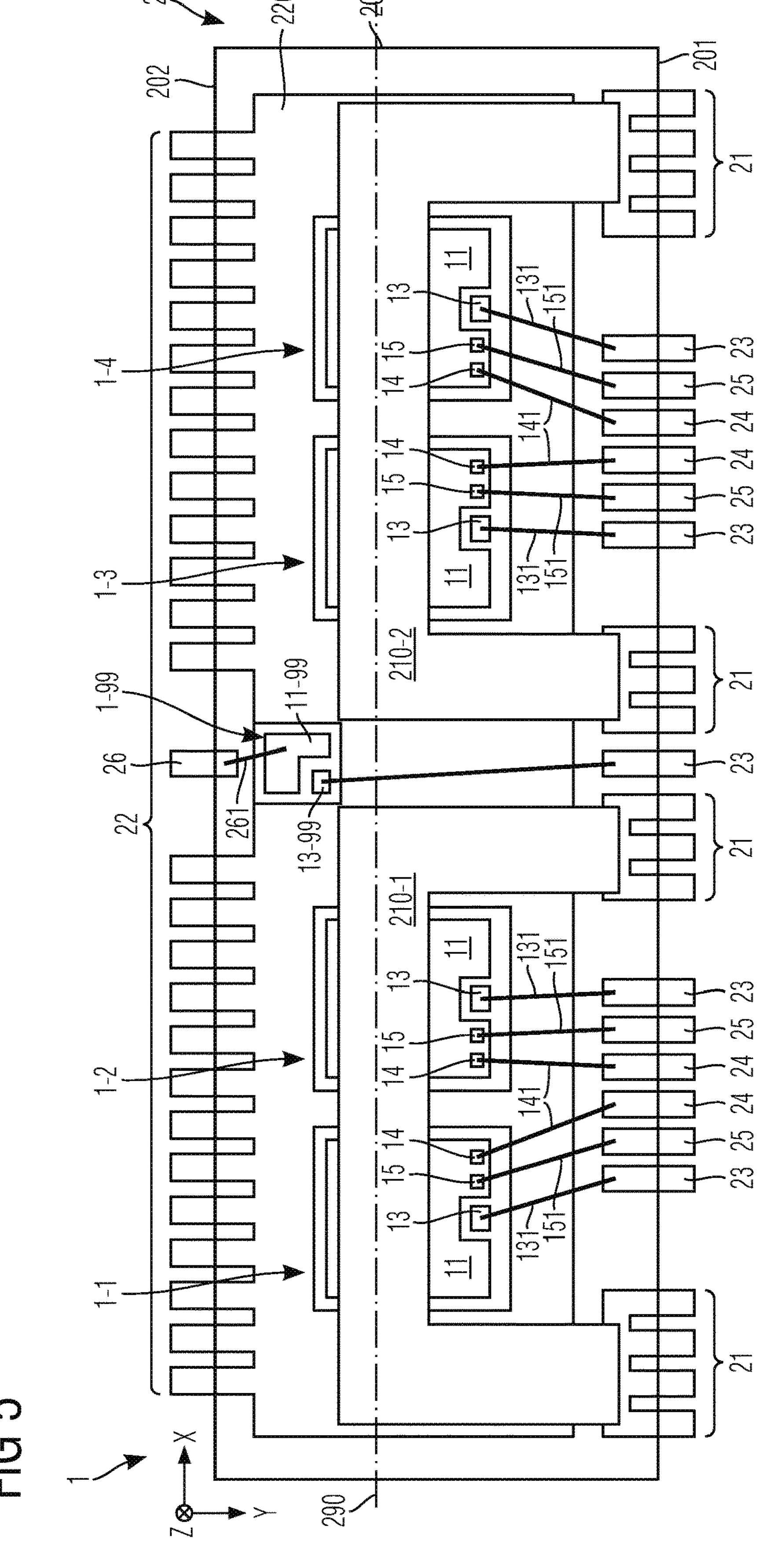

The embodiments illustrated in FIGS. 3 to 5 implement a different approach for the connecting the first load terminals 11. There, some or all of the chip's first load terminals 11 are connected with each other within the package 20. For example, referring to FIGS. 4 and 5, each first load terminal 11 of a first subset of the plurality of the chips 1-1, 1-2 is electrically connected with at least one individual first outside terminal of the plurality of first outside terminals 21, and each first load terminal 11 of a second subset of the plurality of the chips 1-3, 1-4 is electrically connected with at least one other individual first outside terminal of the plurality of first outside terminals 21. For example, the power semiconductor device 1 further comprises a first clip 210-1 forming the electrical connection between the first load terminals 11 of the first subset of the plurality of the chips 1-1, 1-2 and the least one individual first outside terminal 21. A second clip 210-2 forms the electrical connection between the first load terminals 11 of the second subset of the plurality of the chips 1-3, 1-4 and the least one other individual first outside terminal 21. For example, such configuration of the package allows flexible adaptation of the use of the chips, e.g., according to different power classes. For example, in case of six chips, two phases each having respective three chips may be used for mid power class applications, or six chips may be individually used for low power class applications.

The embodiment illustrated in FIG. 5 corresponds to the embodiment of FIG. 4, but further comprises a sense chip 1-99 for sensing the voltage between the first load terminals 11 and the second load terminals 12. To this end, a sixth outside terminal 26 is provided to electrically contact, via bond wire 261 a first load terminal 11-99 of the sense chip 1-99. A second load terminal (not illustrated) of the sense chip 1-99 is electrically connected with the second load terminal of the power semiconductor chips 1-1 to 1-4, e.g., also via the lead frame structure 220. A control terminal 13-99 of the sense chip 1-99 is electrically connected with one of the third outside terminals 23 that is not electrically connected to one of the control terminals of the power semiconductor chips 1-1 to 1-4. Thereby, the sense chip 1-99 may be controlled irrespective of the control of the power semiconductor chips 1-1 to 1-4.

In the embodiment according to FIG. 3, the power semiconductor device 1 further comprises a clip 210, wherein the clip 210 electrically connects each of the first load terminals 11 within the housing 20 with each other and forms the electrical connection between the first load terminals 11 and the first outside terminals 21. In this variant, the first load terminals 11 are electrically connected with each other within the housing 20, and the second load terminals 12 are electrically connected with each other within the housing 20. That is, in this variant, the power semiconductor chips 1-1 to 1-5 are connected in parallel with each other within the housing 20. The clip 210 connects three subsets of the first outside terminals 21 to the first load terminals 11. Yet, since each of the power semiconductor chips 1-1 to 1-5 is associated with said at least one individual third outside terminal 23, each of the power semiconductor chips 1-1 to 1-5 may individually controlled.

In the above, embodiments pertaining to a power semiconductor device including a plurality of chips were explained. For example, these chips are based on silicon (Si) or silicon carbide (SiC). Accordingly, a semiconductor region or layer, e.g., the semiconductor body 10 and its regions/zones, e.g., regions etc. can be a Si-region or Si-layer or a SiC-region or SiC-layer.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), aluminum gallium nitride (AlGaN) and aluminum indium nitride (AlInN). For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc, and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
a package including a housing that has a first side and a second side opposite to the first side;
within the housing, a plurality of power semiconductor chips each comprising:
a semiconductor body;
a first load terminal and a second load terminal coupled to the semiconductor body; and
a control terminal,
wherein the semiconductor body is configured to conduct a load current between the first load terminal and the second load terminal based on a control signal received via the control terminal; and
a plurality of outside terminals configured to provide for an electrical connection between the terminals of the power semiconductor chips within the housing and components of a power circuit external of the package,
wherein the plurality of outside terminals comprises:
one or more first outside terminals electrically connected with the first load terminals;
one or more second outside terminals each of which is electrically connected with each of the second load terminals;
a plurality of third outside terminals, wherein each control terminal is electrically connected with at least one individual third outside terminal of the plurality of third outside terminals,
wherein some or all of the first load terminals are connected with each other within the package,
wherein the power semiconductor device further comprises a clip electrically connecting each of the first load terminals within the housing with each other and forming the electrical connection between the first load terminals and the first outside terminals.

2. The power semiconductor device of claim 1, wherein the power semiconductor chips are identically configured.

3. The power semiconductor device of claim 1, wherein the power semiconductor chips are connected in parallel to fulfill a same switching function.

4. The power semiconductor device of claim 1, wherein the power semiconductor device is a discrete multi-chip power device.

5. The power semiconductor device of claim 1, wherein each of the second outside terminals is arranged at the second side of the housing.

6. The power semiconductor device of claim 1, further comprising a lead frame structure forming both the second outside terminals and the electrical connection between the second outside terminals and the second load terminals of the power semiconductor chips.

7. The power semiconductor device of claim 1, wherein each of the first outside terminals is arranged at the first side of the housing.

8. The power semiconductor device of claim 1, wherein the first load terminals are electrically connected with each other within the housing by the clip and the second load terminals are electrically connected with each other within the housing, such that the power semiconductor chips are connected in parallel with each other within the housing.

9. The power semiconductor device of claim 1, wherein each power semiconductor chip further comprises a sense terminal, wherein the power semiconductor device further comprises a plurality of fourth outside terminals, and wherein each sense terminal is electrically connected with at least one individual fourth outside terminal of the plurality of fourth outside terminals.

10. The power semiconductor device of claim 9, wherein each of the fourth outside terminals is arranged at the first side of the housing.

11. The power semiconductor device of claim 1, wherein the power semiconductor chips are arranged laterally adjacent to each other along a straight line.

12. The power semiconductor device of claim 1, wherein the semiconductor bodies of the power semiconductor chips are made of a wide-bandgap-semiconductor material.

13. The power semiconductor device of claim 1, further comprising a sense chip configured to sense a voltage between the first load terminals and the second load terminals.

14. The power semiconductor device of claim 13, wherein the plurality of outside terminals further comprises a first additional outside terminal electrically connected to a first load terminal of the sense chip.

15. The power semiconductor device of claim 13, wherein a second load terminal of the sense chip is electrically connected with the second load terminal of the power semiconductor chips.

16. The power semiconductor device of claim 15, wherein the second load terminal of the sense chip is electrically connected with the second load terminal of the power semiconductor chips via a lead frame structure.

17. The power semiconductor device of claim 13, wherein a control terminal of the sense chip is electrically connected with one of the third outside terminals that is not electrically connected to one of the control terminals of the power semiconductor chips.

18. A power semiconductor device, comprising:
a package including a housing that has a first side and a second side opposite to the first side;
within the housing, a plurality of power semiconductor chips each comprising:
a semiconductor body;
a first load terminal and a second load terminal coupled to the semiconductor body; and
a control terminal,
wherein the semiconductor body is configured to conduct a load current between the first load terminal and the second load terminal based on a control signal received via the control terminal; and
a plurality of outside terminals configured to provide for an electrical connection between the terminals of the power semiconductor chips within the housing and components of a power circuit external of the package,
wherein the plurality of outside terminals comprises:
one or more first outside terminals electrically connected with the first load terminals;
one or more second outside terminals each of which is electrically connected with each of the second load terminals;
a plurality of third outside terminals, wherein each control terminal is electrically connected with at least one individual third outside terminal of the plurality of third outside terminals,
wherein some or all of the first load terminals are connected with each other within the package, wherein each first load terminal of a first subset of the plurality of the power semiconductor chips is electrically connected with at least one individual first outside terminal of the plurality of first outside terminals, wherein each first load terminal of a second subset of the plurality of the power semiconductor chips is electrically connected with at least one other individual first outside terminal of the plurality of first outside terminals, wherein the power semiconductor device further comprises:

a first clip forming the electrical connection between the first load terminals of the first subset of the plurality of the power semiconductor chips and the least one individual first outside terminal; and a second clip forming the electrical connection between the first load terminals of the second subset of the plurality of the power semiconductor chips and the least one other individual first outside terminal.

19. A power semiconductor device, comprising:

a package including a housing that has a first side and a second side opposite to the first side;

within the housing, a plurality of power semiconductor chips each comprising:

a semiconductor body;

a first load terminal and a second load terminal coupled to the semiconductor body; and a control terminal, wherein the semiconductor body is configured to conduct a load current between the first load terminal and the second load terminal based on a control signal received via the control terminal;

a sense chip configured to sense a voltage between the first load terminals and the second load terminals; and a plurality of outside terminals configured to provide for an electrical connection between the terminals of the power semiconductor chips within the housing and components of a power circuit external of the package, wherein the plurality of outside terminals comprises:

one or more first outside terminals electrically connected with the first load terminals;

one or more second outside terminals each of which is electrically connected with each of the second load terminals;

a plurality of third outside terminals, wherein each control terminal is electrically connected with at least one individual third outside terminal of the plurality of third outside terminals, wherein some or all of the first load terminals are connected with each other within the package.

20. The power semiconductor device of claim 19, wherein the plurality of outside terminals further comprises a first additional outside terminal electrically connected to a first load terminal of the sense chip.

21. The power semiconductor device of claim 19, wherein a second load terminal of the sense chip is electrically connected with the second load terminal of the power semiconductor chips.

22. The power semiconductor device of claim 21, wherein the second load terminal of the sense chip is electrically connected with the second load terminal of the power semiconductor chips via a lead frame structure.

23. The power semiconductor device of claim 19, wherein a control terminal of the sense chip is electrically connected with one of the third outside terminals that is not electrically connected to one of the control terminals of the power semiconductor chips.

* * * * *